(12) United States Patent
Lee

(10) Patent No.: US 11,069,752 B2
(45) Date of Patent: Jul. 20, 2021

(54) DISPLAY DEVICE AND MANUFACTURING METHOD THEREOF

(71) Applicant: Samsung Display Co., LTD., Yongin-si (KR)

(72) Inventor: Hyeon Bum Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/749,437

(22) Filed: Jan. 22, 2020

(65) Prior Publication Data

US 2020/0251528 A1 Aug. 6, 2020

(30) Foreign Application Priority Data

Feb. 1, 2019 (KR) .......................... 10-2019-0013736

(51) Int. Cl.
*G09G 3/30* (2006.01)
*H01L 27/32* (2006.01)
*H01L 51/50* (2006.01)
*G06F 3/041* (2006.01)

(52) U.S. Cl.
CPC .......... *H01L 27/322* (2013.01); *G06F 3/0412* (2013.01); *H01L 51/5044* (2013.01)

(58) Field of Classification Search
CPC ................... G06F 3/0412; G06F 3/044; G06F 2203/04103; H01L 27/322; H01L 27/323; H01L 51/5044; H01L 27/3246; H01L 51/5225; H01L 27/3211; H01L 51/5265; H01L 27/3276

USPC ....................................................... 345/76, 173
See application file for complete search history.

(56) References Cited

U.S. PATENT DOCUMENTS

| | | | | |
|---|---|---|---|---|
| 6,396,559 B1* | 5/2002 | Kishimoto | .......... | G02F 1/13394 349/123 |
| 2014/0293199 A1* | 10/2014 | Sakae | ............... | G02F 1/134363 349/106 |
| 2018/0181240 A1* | 6/2018 | Heo | ...................... | H01L 27/322 |
| 2019/0326359 A1* | 10/2019 | Yang | ...................... | G06F 3/0412 |

(Continued)

FOREIGN PATENT DOCUMENTS

| KR | 10-2015-0069712 | 6/2015 |
|---|---|---|
| KR | 10-2016-0044414 | 4/2016 |
| KR | 10-2017-0113821 | 10/2017 |

(Continued)

*Primary Examiner* — Jennifer T Nguyen
(74) *Attorney, Agent, or Firm* — Kile Park Reed & Houtteman PLLC

(57) ABSTRACT

A display device and a manufacturing method which minimize a difference in touch sensitivity between regions of a display device are disclosed. The display includes a display area, a color filter area disposed over the display area, and a touch area disposed between the display area and the color filter area. The display area includes a substrate, an insulating layer disposed over the substrate, first and second electrodes, partition walls disposed between the insulating layer and the second electrode, an emission layer disposed in an opening formed by the first and second electrodes and adjacent partition walls, and a spacer disposed on at least one of the partition walls. The color filter area includes a first light blocking member disposed at a region overlapping the spacer and including at least two color filters stacked on each other.

24 Claims, 18 Drawing Sheets

(56) References Cited

U.S. PATENT DOCUMENTS

2020/0027933 A1* 1/2020 Heo .................. H01L 27/3223

FOREIGN PATENT DOCUMENTS

| KR | 10-2017-0140482 | 12/2017 |
| KR | 10-2018-0005327 | 1/2018 |
| KR | 10-2018-0011919 | 2/2018 |
| KR | 10-2018-0036847 | 4/2018 |

* cited by examiner

DISPLAY DEVICE AND MANUFACTURING METHOD THEREOF

CROSS-REFERENCE TO RELATED APPLICATION

This application claims priority to and benefits of Korean Patent Application No. 10-2019-0013736 under 35 U.S.C. § 119, filed in the Korean Intellectual Property Office on Feb. 1, 2019, the entire contents of which are incorporated herein by reference.

BACKGROUND

(a) Technical Field

The present disclosure relates to a display device and a manufacturing method thereof, and more specifically, to a display device and a manufacturing method thereof, which minimize a difference in touch sensitivity between regions of the display device.

(b) Description of the Related Art

The importance of display devices as communication media, has been emphasized because of the increasing developments of information technology. Also, users of display devices such as a liquid crystal display (LCD) and an organic light emitting diode (OLED) display have been increasing and becoming more popular.

Each pixel of an organic light emitting diode display includes two electrodes and an organic emission layer disposed therebetween. Electrons injected from a cathode, which is one of the two electrodes, and holes injected from an anode, which is the other of the two electrodes, are combined in the organic emission layer to form excitons. The excitons emit light while emitting energy.

In general, the organic emission layer of the organic light emitting diode display may be formed by using a mask or the like. In the process of positioning the mask, the organic emission layer or other elements of the display device and the mask are in contact with each other. In such a contact step, such elements of the display device may be damaged.

Further, a touch sensor for inputting information by touching a screen with a finger, a pen, or the like is generally applied to the display device. A capacitive type touch sensor is one of various types of touch sensors. The capacitive sensor is mainly used to detect a position where a capacitance change caused by such contact occurs at two spaced apart electrodes.

It is desired that the display device is made thin to achieve or improve its flexibility. The touch sensor is built in the display device for this purpose. Especially, an on-cell type of touch sensor does not have its own substrate so that its sensing electrode is directly formed on an element of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Exemplary embodiments have been made in an effort to provide a display device and a manufacturing method thereof, which improves touch sensitivity of the display device.

An exemplary embodiment of the invention provides a display device including: a display area; a color filter area disposed over the display area; and a touch area disposed between the display area and the color filter area, wherein the display area includes: a substrate on which transistors are disposed; an insulating layer disposed over the substrate and the transistors; a first electrode connected with the transistors and disposed over the insulating layer; a second electrode disposed over the first electrode; partition walls disposed between the insulating layer and the second electrode; an emission layer disposed in an opening formed by the first electrode, the second electrode, and adjacent partition walls; and a spacer disposed on at least one of the partition walls, and wherein the color filter area includes: a first light blocking member disposed at a region overlapping the spacer, the first light blocking member including at least two color filters stacked on each other.

The region at which the first light blocking member is disposed and a region at which the spacer is disposed are facing and overlapping each other.

The first light blocking member may include portions of a red color filter and a blue color filter, which are stacked on each other.

A second light blocking member may be disposed at a region overlapping at least one of the partition walls other than the at least one of the partition walls on which the spacer may be disposed.

The touch area may include a first sensing electrode disposed at a region overlapping the first light blocking member, and another first sensing electrode disposed at a region overlapping the second light blocking member.

A distance between the second electrode and the first sensing electrode may be smaller than a distance between the second electrode and the another first sensing electrode.

The distance between the second electrode and the first sensing electrode may be in a range of about 6 μm to about 8 μm.

The distance between the second electrode and the another first sensing electrode may be in a range of about 8 μm to about 10 μm.

The touch area may also include a second sensing electrode having a mesh structure with at least one of the first sensing electrode and the another first sensing electrode.

The at least one of the first sensing electrode and the another first sensing electrode may not overlap the emission layer.

The spacer may have a height in a range of about 1 μm to about 2 μm.

The first light blocking member may further include a portion of a green color filter, wherein the portions of the green color filter, the red color filter, and the blue color filter may be stacked on each other.

The second light blocking member may include carbon black.

The display area may include spacers each disposed on a corresponding one of the partition walls, and a disposal density of the spacers may be in a range of about 5% to about 20%. The disposal density is a ratio between a number of partition walls on which spacers are respectively disposed and a total number of the partition walls in the display area.

The display device may not include a polarization layer.

The partition walls and the spacer may be formed of a same material, and may be connected together.

The partition walls and the spacer may be formed of a different material.

The region at which the first sensing electrode is disposed is overlapping and facing a region at which the first light blocking member is disposed and a region at which the spacer is disposed.

An exemplary embodiment of the invention provides a manufacturing method of a display device, including: forming a display area including an emission layer, a partition wall, and a spacer disposed on the partition wall; forming a touch area overlapping the display area, the touch area including a sensing electrode; forming a first color filter over the touch area to overlap the spacer and the emission layer; forming a second color filter over the touch area to overlap the spacer and the emission layer; and forming a first light blocking member disposed at a region overlapping the spacer. The forming the first light blocking member may include disposing a portion of the first color filter at the region overlapping the spacer; and disposing a portion of the second color filter at the region overlapping the spacer by stacking the portion of the second color filter on the portion of the first color filter.

In the forming of the display device may include forming a third color filter over the touch area to overlap the spacer and the emission layer, wherein the forming the first light blocking member may further include disposing a portion of the third color filter at the region overlapping the spacer so that the portions of the first, second and third color filters are stacked on each other at the region overlapping the spacer.

The first color filter may be a red color filter, the second color filter may be a blue color filter, and the third color filter may be a green color filter. The portion of the first color filter may be disposed between the portion of the second color filter and the portion of the third color filter.

The manufacturing method may further include forming another partition wall on which no spacer is disposed, and forming a second light blocking member disposed at a region overlapping the another partition wall.

The forming the touch area may include forming a sensing electrode disposed at a region overlapping the first light blocking member, and forming another sensing electrode disposed at a region overlapping the second light blocking member.

In the forming of the display area, the partition wall and the spacer may be formed in a single process.

The forming the display area may include forming the spacer on the partition wall to have a height in a range of about 1 μm to about 2 μm.

In the display device and a manufacturing method thereof according to an embodiment of the invention, a difference in touch sensitivity between regions of the display device may be alleviated or minimized by employing a light blocking member including color filters in a region overlapping a spacer.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
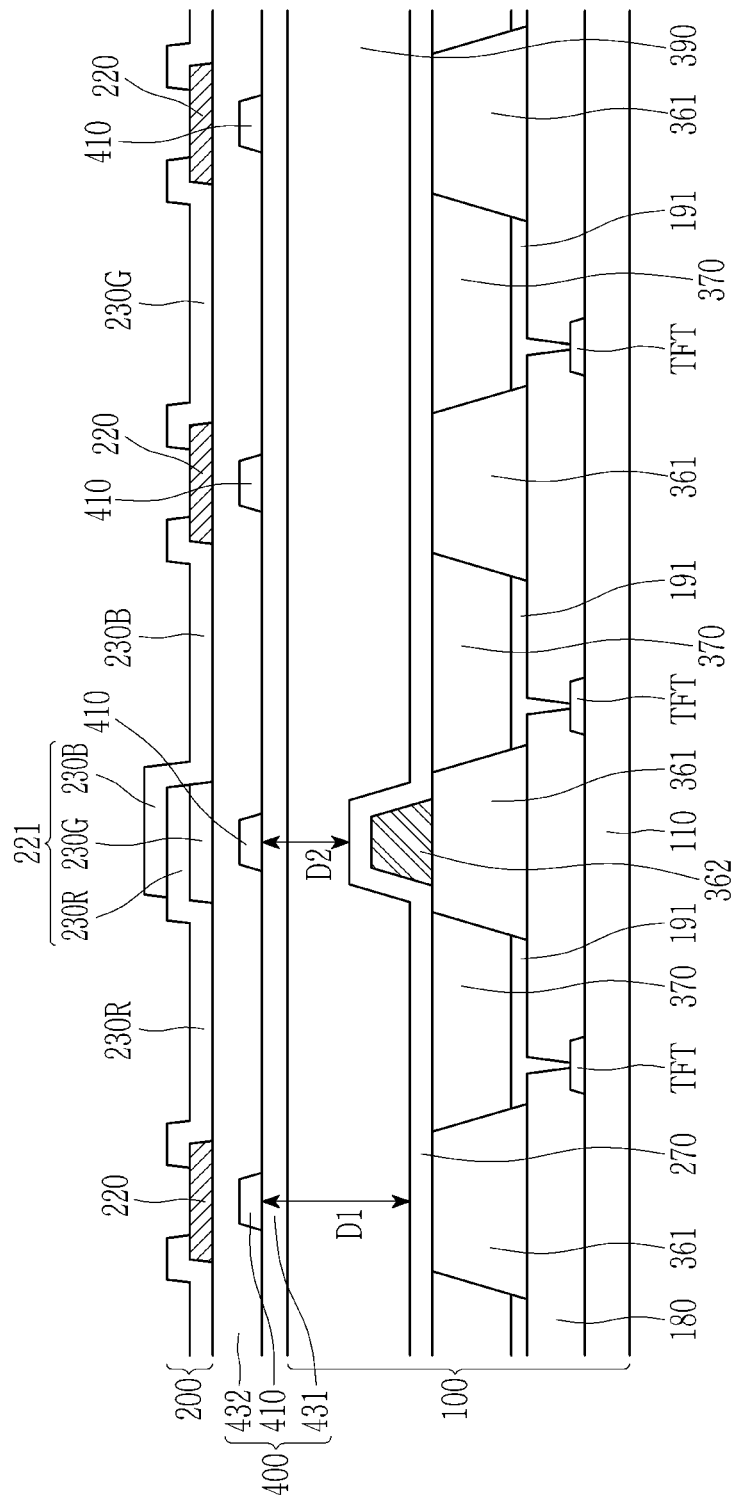
FIG. 1 illustrates a cross-section of a display device according to an embodiment of the invention.

Embodiments of the invention will be described hereinafter with reference to the accompanying drawings. Although the invention may be modified in various manners and have additional embodiments, embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the invention.

Some of the parts which are not associated with the description may not be provided in order to describe embodiments of the invention and like reference numerals refer to like elements throughout the specification.

In the drawings, sizes and thicknesses of elements may be enlarged for clarity and ease of description thereof. However, the invention is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 illustrates a cross-section of a display device according to an embodiment of the invention. Referring to FIG. 1, the display device includes a display area 100, a touch area 400, and a color filter area 200.

The display area 100 includes a substrate 110 and a transistor TFT disposed on the substrate 110. The transistor TFT is connected to a first electrode 191 through a contact hole disposed in an insulating layer 180. The display area 100 includes a second electrode 270 which may be disposed over the first electrode 191. The display area 100 includes partition walls 361 which may be disposed between the insulating layer 180 and the second electrode 270. An emission layer 370 is disposed in an opening which may be formed or surrounded by the first electrode 191, the second electrode 270, and adjacent ones of the partition walls 361.

A portion of a partition wall 361 may be protruded upward to constitute a spacer 362. The spacer 362 may also be formed or disposed on the top of the partition wall 361. The spacer 362 may prevent the partition walls 361 from being damaged in the process of positioning a mask for forming the emission layer 370. The spacer 362 may be in contact with the mask used in a process of forming an organic emission layer of the emission layer 370. In other words, the spacer 362 may prevent direct contact between the partition walls 361 and the mask. When the partition walls 361 and the mask are directly in contact with each other, the contact area is wide and the mask and the partition walls 361 may not be separated well, and layers including the partition walls 361 may peel off during a mask separation process. However, the contact area between the partition walls 361 and the mask may be reduced by placing the spacer 362 on one or more of the partition walls 361 and allowing the spacer 362 to directly contact the mask, thereby easily separating the mask.

The spacer 362 may be disposed on only some of the partition walls 361. For example, the spacer 362 may only be disposed on one or two of 10 to 20 partition walls. That is, the disposal density of the spacer 362 may be about 5% to about 20%. The disposal density is a ratio between a number of partition walls on which spacer(s) is/are respectively disposed and a total number of the partition walls in the display area 100. More specifically, the disposal density may be a value obtained by dividing the number of the partition walls where the spacer(s) is/are respectively disposed by the total number of the partition walls in the display area 100. It should be noted that the number of partition walls is not limited to 10 to 20.

A distance between the spacer 362 and an edge of an opening of the partition wall 361 may be in a range of about 5 μm to about 10 μm. A width and a length of the spacer 362 each may be in a range of about 10 μm to about 25 μm. The distance, the width, and the length are measured based on a lower portion of the spacer 362. Areas of a lower surface and an upper surface of the spacer 362 may be different, and the width and the length of the spacer 362 in this description are measured based on the lower surface of the spacer 362. The distance between the spacer 362 and the edge of the opening of the partition wall 361 may also be measured with reference to an edge of the lower surface of the spacer 362.

A height of the spacer 362 from the partition wall 361 may be in a range of about 1 µm to about 2 µm. The height of the spacer 362 in this description may be a distance between a top surface of the partition wall 361 and the lower surface of the spacer 362 or a step difference between the partition wall 361 and the spacer 362.

FIG. 1 illustrates a configuration in which a portion of the partition wall 361 serves as the spacer 362. The partition wall (or the partition walls) 361 and the spacer 362 may be formed in a single process. The partition wall (or the partition walls) 361 and the spacer 362 may include or be formed of a same material. However, the partition wall (or the partition walls) 361 and the spacer 362 may be formed in separate processes. The partition wall (or partition walls) 361 and the spacer 362 may also include or be formed of different materials.

The second electrode 270 is disposed on the partition walls 361 and the spacer 362. An encapsulation portion 390 is disposed on the second electrode 270. The encapsulation portion 390 may include an organic layer and/or an inorganic layer.

The touch area 400 includes a first insulating layer 431, a first sensing electrode 410, a second sensing electrode (not illustrated in FIG. 1), and a second insulating layer 432. The second sensing electrode is not illustrated in FIG. 1, but may be disposed on the first insulating layer 431 (refer to FIG. 8). More description of the touch area 400 follows below.

The color filter area 200 may include a first color filter, a second color filter and a third color filter which may be implemented with, for example, a red color filter 230R, a green color filter 230G, and a blue color filter 230B, respectively. The red color filter 230R, the green color filter 230G, and the blue color filter 230B may affect transmittance of light in the display device, for example, by low reflection of light. The color filters may be disposed over or overlapping the emission layer 370.

The display device may include light blocking members, for example, in the color filter area 200. In this embodiment, the color filter area 200 includes first and second light blocking members. The first light blocking member 221 may be implemented with a color filter light blocking member which includes two or more color filters stacked on each other. The first light blocking member 221 may be disposed at a region overlapping the spacer. In other words, the region at which the first light blocking member 221 is disposed and a region at which the spacer 362 is disposed are overlapping, facing and/or corresponding each other. The first light blocking member 221 may include at least two color filters stacked on each other. In particular, the first light blocking member 221 may include a portion of each of the at least two color filters, where the portions of the at least two color filters are stacked on each other.

The second light blocking member 220 may be disposed at a region overlapping at least one of the partition walls 361 other than the at least one of the partition walls 361 on which the spacer 362 is disposed. As shown in FIG. 1, the display area 100 includes the partition wall on which the spacer 362 is disposed and the partition walls on which no spacer is disposed. The second light blocking member 220 may be disposed at a region overlapping at least one of the partition walls on which no spacer is disposed. The second light blocking member 220 may include, for example, carbon black.

In the embodiment of FIG. 1, the first light blocking member 221 is disposed, in lieu of a second or other blocking member, in a region overlapping the spacer 362.

As mentioned above, the first light blocking member 221 may include two or more color filters, for example, the red color filter 230R, the green color filter 230G, and the blue color filter 230B. For example, a portion of each color filter may be stacked on each other to form the first light blocking member 221. The portion of each color filter may be a portion extended from a side or an edge of each color filter. The first light blocking member 221 may absorb and block light as similarly does the second light blocking member 220.

Referring to FIG. 1, as mentioned above, at the region overlapping the spacer 362 of the display area 100, the first light blocking member 221 including the color filters is disposed in lieu of the second light blocking member 220. The region at which the first light blocking member 221 is disposed is over and overlapping an area at which the spacer 362 is disposed in a direction that is perpendicular to a surface of the substrate 110. Owing to the employment of the first light blocking member 221 and its configuration, a sensitivity difference of the touch area 400 may be alleviated or minimized. In this description, the sensitivity difference may be a difference in touch sensitivity between the region where the spacer 362 is disposed and the region where no spacer is disposed.

Referring to FIG. 1, a distance D1 between the second electrode 270 and the first sensing electrode 410 over the partition wall 361 where no spacer is disposed is different from a distance D2 between the second electrode 270 and the first sensing electrode 410 disposed at the region where the spacer 362 is disposed. The spacer 362 may be formed, for example, by being protruded from the partition wall 361. In this structure, the distance D2 between the second electrode 270 and the first sensing electrode 410 disposed at the region where the spacer 362 is disposed is smaller than the distance D1 between the second electrode 270 and the first sensing electrode 410 over the partition wall 361 where no spacer is disposed.

For example, the distance D1 between the second electrode 270 and the first sensing electrode 410 at the region overlapping the partition wall 361 where no spacer is disposed may be in a range of about 8 µm to about 10 µm. For example, the distance D2 between the second electrode 270 and the first sensing electrode 410 disposed at the region overlapping the spacer 362 may be in a range of about 6 µm to about 8 µm.

When the distance D1 and the distance D2 are different between the second electrode 270 and the first sensing electrode 410, a difference in touch sensitivity may result. The electrostatic capacitance varies depending on the thickness of a dielectric layer between the second electrode 270 and the first sensing electrode 410, and such electrostatic capacitance affects the touch sensitivity.

As the distance between the second electrode 270 and the first sensing electrode 410 is shortened, the influence of the second electrode 270 is increased and the touch sensitivity is decreased. Accordingly, the touch sensitivity may be different between at the region overlapping the partition wall 361 where no spacer is disposed and at the region overlapping the spacer 362, which may affect the touch quality of the display device.

However, in the display device according to the embodiment of FIG. 1, the difference in touch sensitivity at the different regions is minimized by disposing the first light blocking member 221 including the color filters in lieu of the second light blocking member 220 at the region where the spacer is disposed. Disposition or implementation of the first light blocking member 221 may be achieved by removing a second light blocking member by replacing it with the first light blocking member 221 at the region overlapping the spacer 362.

The second light blocking member 220 may include carbon black for blocking light, and the touch sensitivity is reduced by the carbon black. Since the carbon black has conductivity, it affects touch sensitivity. However, in the display device according to the embodiment of FIG. 1, since the first light blocking member 221 including the color filters is disposed in lieu of the second light blocking member 220, the touch sensitivity may not be degraded at the region overlapping the spacer 362, and thereby the sensitivity difference is minimized in the display device.

In other words, the touch sensitivity may not be reduced at the region overlapping the spacer 362, and the touch sensitivity at the region overlapping the spacer 362 may be similar to that of the region overlapping the partition wall 361 where no spacer is disposed.

Figure 2:
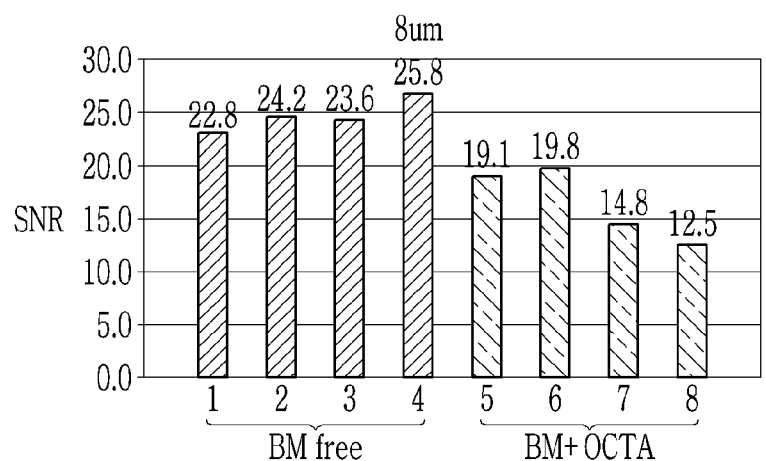
FIG. 2 illustrates a graph showing a result of measuring the touch sensitivity (SNR) when there is no light blocking member and when there is a light blocking member in condition that a distance between two sensing electrodes is about 8 μm.
Figure 3:
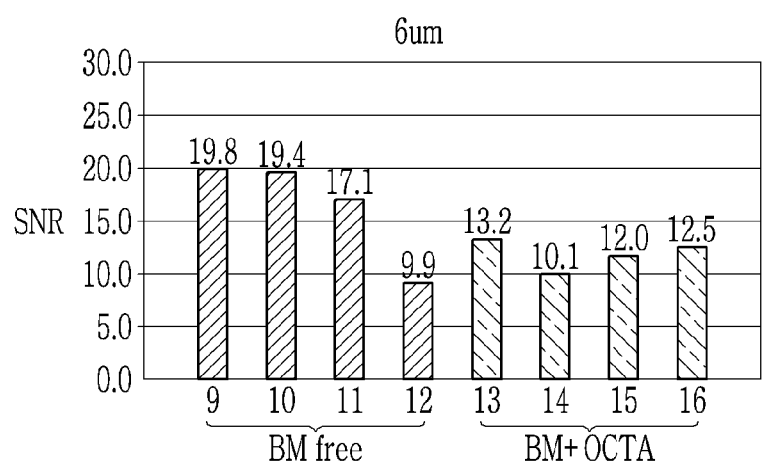
FIG. 3 illustrates a graph showing a result of measuring the touch sensitivity (SNR) when there is no light blocking member and when there is a light blocking member in condition that a distance between two sensing electrodes is about 6 μm.

FIG. 2 illustrates a graph showing a result of measuring the touch sensitivity (SNR) when there is no light blocking member (BM Free) and when there is a light blocking member (BM+OCTA) when a distance between the second electrode 270 and the first sensing electrode 410 is about 8 µm. FIG. 3 illustrates a graph showing a result of measuring the touch sensitivity (SNR) when there is no light blocking member (BM Free) and when there is a light blocking member (BM+OCTA) when a distance between the second electrode 270 and the first sensing electrode 410 is about 6 µm. In FIG. 2 and FIG. 3, four display panels were tested for each condition.

The measurement conditions and results of Examples 1 to 16 shown in FIG. 2 and FIG. 3 are summarized in Table 1 below.

TABLE 1

Average Touch Sensitivity as a Function of Electrode Distance and Presence or Absence of Light Blocking Member

| | Distance (µm) (approximate) | Light blocking member | Touch sensitivity | Touch sensitivity average |
|---|---|---|---|---|
| Example 1 | 8 | X | 22.8 | 24.1 |
| Example 2 | 8 | X | 24.2 | |
| Example 3 | 8 | X | 23.6 | |
| Example 4 | 8 | X | 25.8 | |
| Example 5 | 8 | O | 19.1 | 16.5 |
| Example 6 | 8 | O | 19.8 | |
| Example 7 | 8 | O | 14.8 | |
| Example 8 | 8 | O | 12.5 | |
| Example 9 | 6 | X | 19.8 | 16.5 |
| Example 10 | 6 | X | 19.4 | |
| Example 11 | 6 | X | 17.1 | |
| Example 12 | 6 | X | 9.9 | |
| Example 13 | 6 | O | 13.2 | 11.9 |
| Example 14 | 6 | O | 10.1 | |
| Example 15 | 6 | O | 12.0 | |
| Example 16 | 6 | O | 12.5 | |

Comparing Examples 1 to 4 and Examples 9 to 12, it is seen that the touch sensitivity is different according to the distance between the second electrode 270 and the first sensing electrode 410 in condition that no light blocking member is provided.

That is, it is seen that the touch sensitivity is higher when the distance between the second electrode 270 and the first sensing electrode 410 is about 8 µm (Examples 1 to 4) than when the distance between the second electrode 270 and the first sensing electrode 410 is about 6 µm (Examples 9 to 12)

Comparing the averages, the touch sensitivity is about 24.1 when the distance is to about 8 µm and the touch sensitivity is about 16.5 when the distance is about 6 µm, when no light blocking member is provided.

Comparing Examples 1 to 4, Examples 5 to 8, Examples 9 to 12, and Examples 13 to 16, touch sensitivity is different depending on whether the light blocking member is present or absent under the same condition that the distance between the second electrode 270 and the first sensing electrode 410 is about 8 µm.

In other words, the touch sensitivity is higher where no light blocking member is provided (Examples 1 to 4) than where the light blocking member is provided (Examples 5 to 8). Comparing the averages, the touch sensitivity average is about 24.1 when no light blocking member is provided and the touch sensitivity is about 16.5 when the light blocking member is provided, in condition that the distance is the same.

Similarly, comparing Examples 9 to 12 and Examples 13 to 16, the touch sensitivity is different depending on whether the light blocking member is present or absent under the same condition that the distance between the second electrode 270 and the first sensing electrode 410 is about 6 µm.

In other words, the touch sensitivity is higher where no light blocking member is provided (Examples 9 to 12) than where the light blocking member is provided (Examples 13 to 16). Comparing the averages, the touch sensitivity average is about 16.5 when no light blocking member is provided and the touch sensitivity is about 11.9 when the light blocking member is provided.

As can be seen from Table 1, FIG. 2, and FIG. 3, the touch sensitivity increases as the distance between the second electrode 270 and the first sensing electrode 410 increases, and is higher where no light blocking member is provided than where the light blocking member is provided.

In Table 1, the touch sensitivity average of Examples 5 to 8 is about 16.5 in condition that the distance between the second electrode 270 and the first sensing electrode 410 is about 8 µm and the light shielding member is provided. The touch sensitivity average of Examples 9 to 12 is about 16.5 in condition that the distance between the second electrode 270 and the first sensing electrode 410 is about 6 µm and no light shielding member is provided.

As a result, Examples 9 to 12 have similar touch sensitivity to Examples 5 to 8 because the distance between the second electrode 270 and the first sensing electrode 410 is shorter than that of Examples 5 to 8, but the light blocking member is not provided.

As shown in Table 1, results of Examples 5 to 8 correspond to the touch sensitivity at the region overlapping the partition walls 361 without the spacer 362, and results of Examples 9 to 12 correspond to the touch sensitivity at the region overlapping the spacer 362.

As can be seen from the above results, in the display device according to an exemplary embodiment of the invention, the difference in touch sensitivity caused by the distance difference between the region overlapping the spacer 362 and the region overlapping the partition walls 361 without the spacer is minimized by employing the first light blocking member 221 in lieu of the second light blocking member 220 at the region overlapping the spacer 362.

In an embodiment, the display device may not include a polarization layer. In an embodiment that the display device includes the color filter area 200, the luminance may be partially reduced. In case that a polarizing layer is included, the luminance may be further decreased, which is undesirable.

Figure 4:
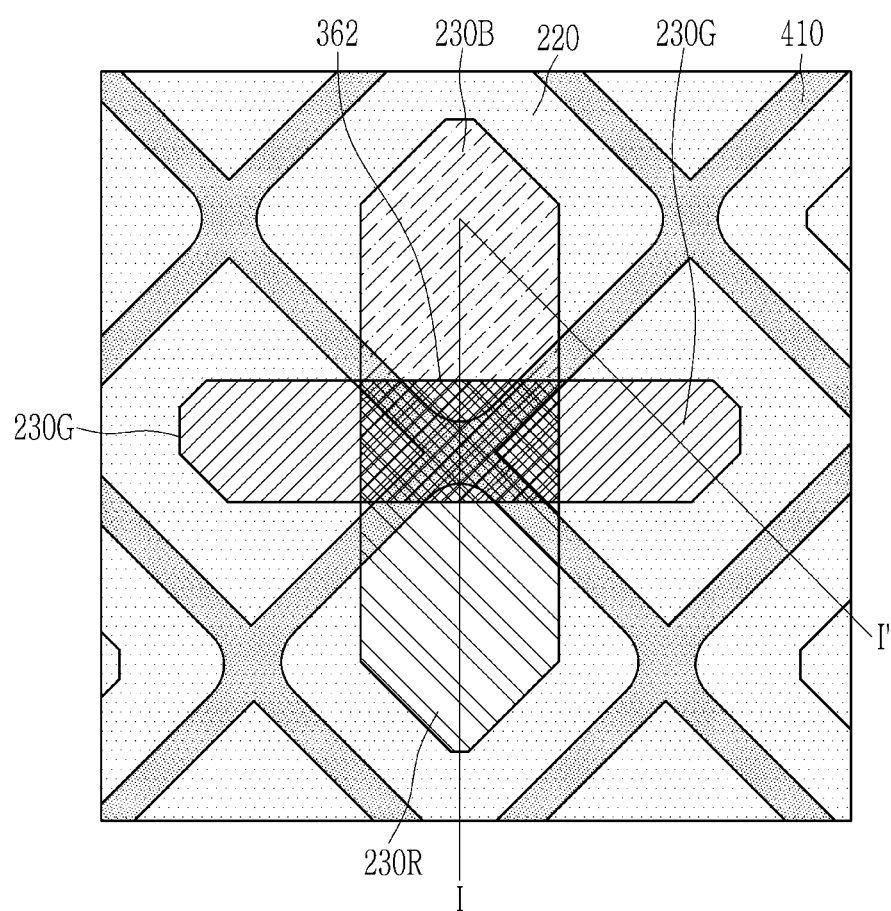
FIG. 4 illustrates a schematic top plan view of a portion of a display device according to an exemplary embodiment of the invention.

FIG. 4 illustrates a schematic top plan view of a portion of a display device according to an exemplary embodiment of the invention. Referring to FIG. 4, the first sensing electrode 410 is disposed between the color filters 230B, 230G, and 230R and the spacer 362. As such, a distance between the first sensing electrode 410 and the second electrode (refer to FIG. 1) in a region where the first sensing electrode 410 and the spacer 362 overlap each other is shorter than the distance in a region where no spacer exists, whereby the touch sensitivity is changed. This problem of inconsistency of the touch sensitivity is solved by employing the first light blocking member 221 in lieu of the second light blocking member 220 in the region overlapping the spacer 362. FIG. 1 corresponds to a cross-section taken along line I-I' of FIG. 4.

The first light blocking member 221 is disposed in the region where the second light blocking member 220 is removed to block light. Although a configuration in which the color filters 230R, 230G, and 230B do not entirely overlap the second light blocking member 220 is illustrated in FIG. 4, the second light blocking member 220 may partially overlap edges of the color filters 230R, 230G, and 230B.

Figure 5:
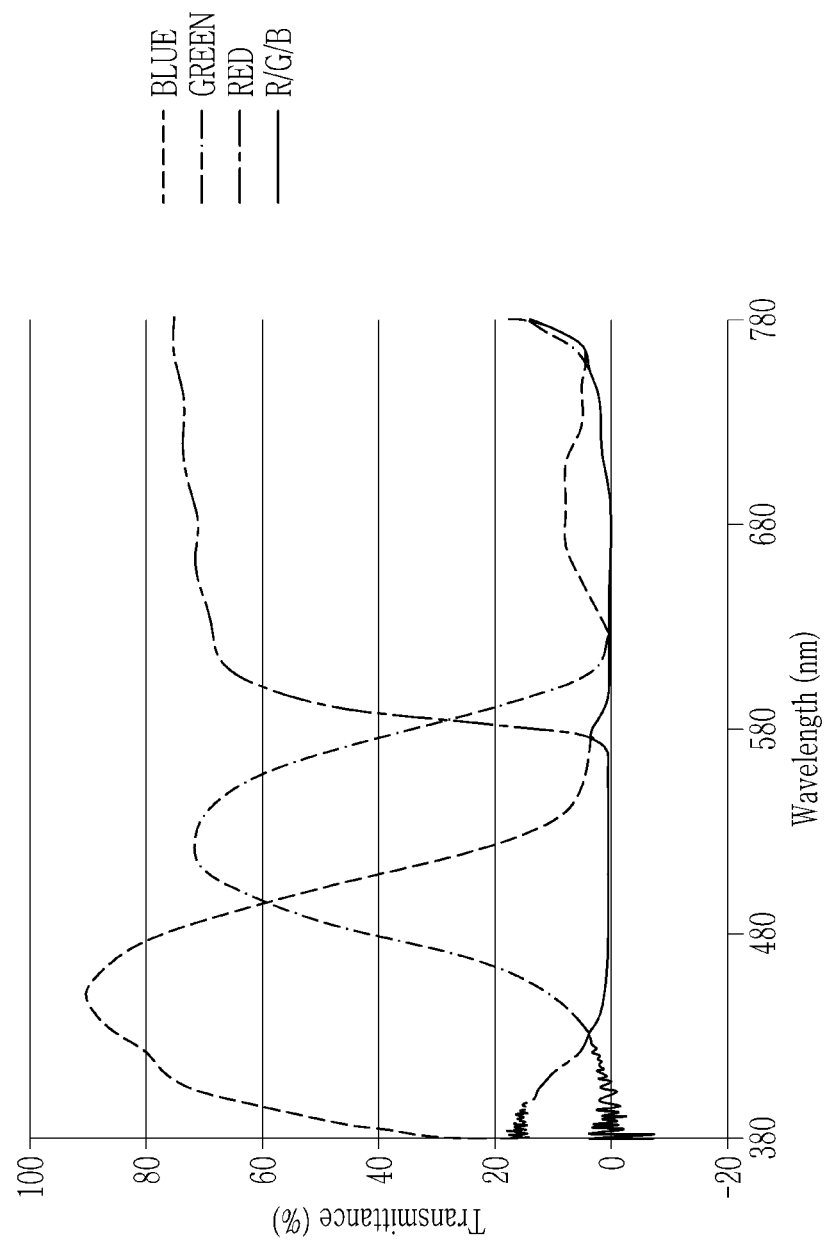
FIG. 5 illustrates a graph showing a result of measuring the transmittance depending on a wavelength of a color filter and stacked color filters.

FIG. 5 illustrates a graph showing a result of measuring the transmittance as a function of wavelength of a color filter and a color filter light blocking member. Referring to FIG. 5, the first light blocking member including the three color filters (R/G/B) exhibits low transmittance in the wavelength range of visible light. Accordingly, the first light blocking member (R/G/B) may perform a light blocking function even when the second light blocking member 220 is removed.

Further description of the structure and the relationship of the touch area 400 and the display area 100 of the display device according to an embodiment is provided below with reference to the drawings.

Figure 6:
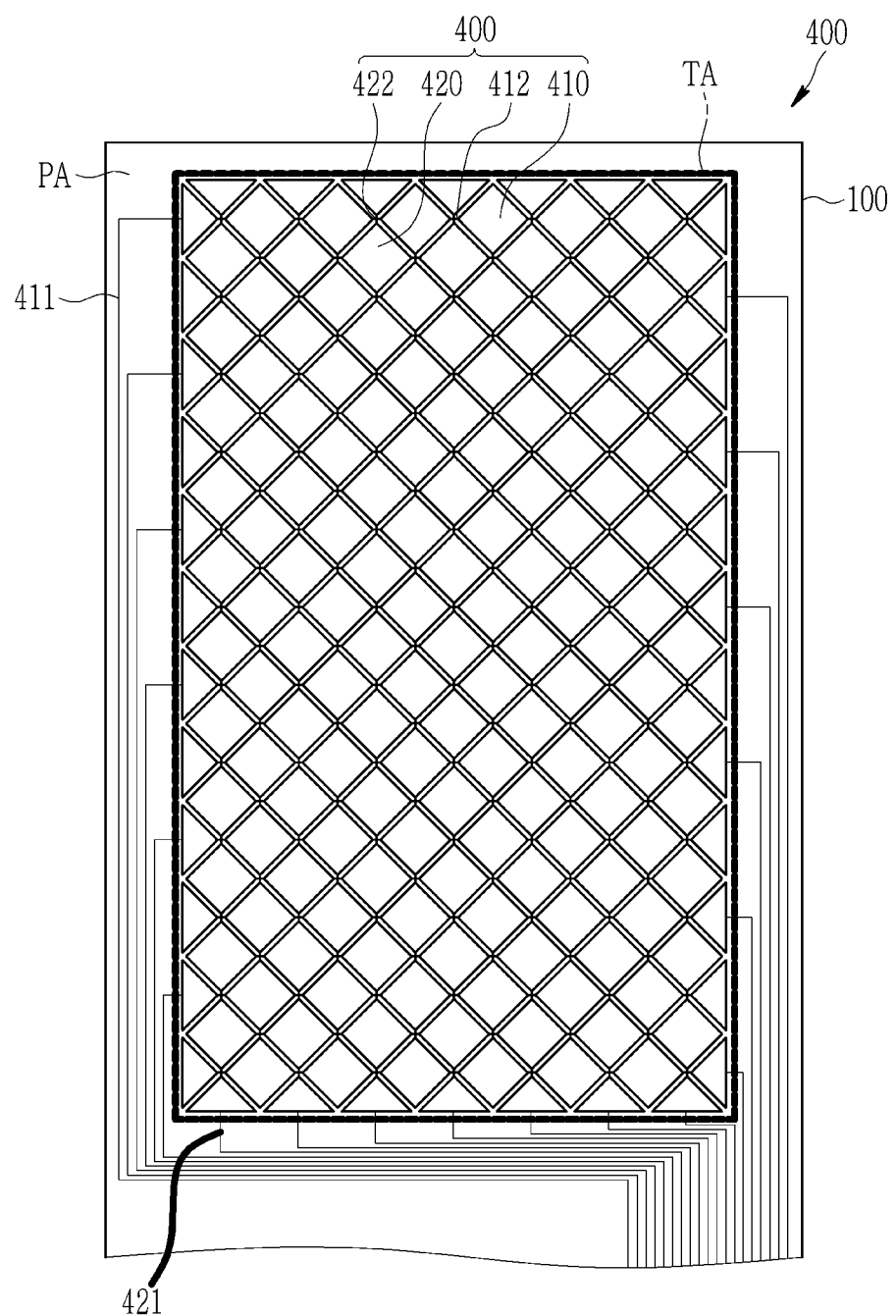
FIG. 6 illustrates a top plan view of a touch area of a display device according to an exemplary embodiment of the invention.
Figure 7:
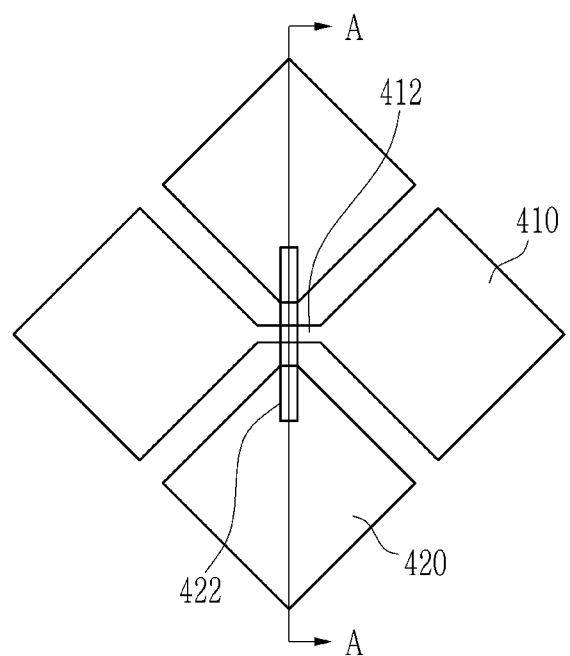
FIG. 7 illustrates an enlarged view of a portion of the touch area illustrated in FIG. 6.
Figure 8:
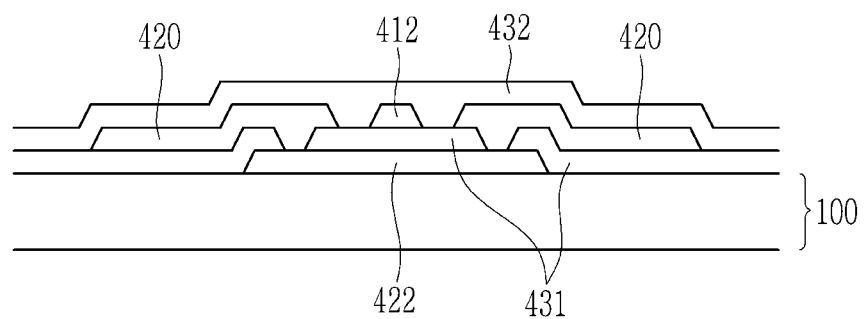
FIG. 8 illustrates a cross-sectional view taken along line A-A of the touch area illustrated in FIG. 7.
Figure 9:
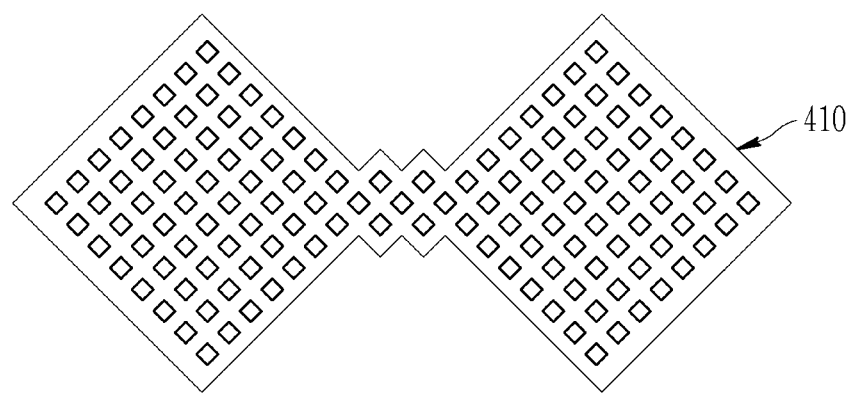
FIG. 9 illustrates a partial top plan view of a sensing electrode in the touch area illustrated in FIG. 6.

FIG. 6 illustrates a partial top plan view of a touch area of a display device according to an exemplary embodiment of the invention, FIG. 7 illustrates an enlarged view of a portion of the touch area illustrated in FIG. 6, and FIG. 8 illustrates a cross-sectional view taken along line A-A of the touch area illustrated in FIG. 7. FIG. 9 illustrates a partial top plan view of a first sensing electrode illustrated in FIG. 6.

The touch sensor in the touch area can detect contacts in various ways. For example, the touch sensor may be classified as a resistive type, a capacitive type, an electromagnetic type, and an optical type. Herein, a capacitive type of touch sensor is taken as an example.

Referring to FIG. 6, the touch area includes sensing electrodes 410 and 420. The sensing electrodes may include first sensing electrodes 410 and second sensing electrodes 420. The first sensing electrodes 410 and the second sensing electrodes 420 may be separated from each other.

The first sensing electrodes 410 and the second sensing electrodes 420 may be alternately dispersed so as to not overlap each other in a touch region TA of the display area 100. The first sensing electrodes 410 may be disposed in plural in a column direction and may be disposed in plural in a row direction, and the second sensing electrodes 420 may also be disposed in plural in a column direction and may be disposed in plural in a row direction.

The first sensing electrodes 410 and the second sensing electrodes 420 may be disposed on a same layer, or may be disposed on different layers. The first sensing electrodes 410 and the second sensing electrodes 420 may be generally rectangular, but the invention is not limited thereto, as the first and second sensing electrodes may have various forms, e.g., a polygon such as a hexagon, a circular shape, or an elliptical shape, or may have protrusions for improved sensitivity of the touch sensor. Each of the first sensing electrodes 410 and the second sensing electrodes 420 may be in the form of a mesh as illustrated in FIG. 9.

At least some of the first sensing electrodes 410 arranged in a same row or column may be connected to each other at the inside or outside of the touch region TA, or may be separated from each other. Similarly, at least some of the second sensing electrodes 420 arranged in a same row or column may be connected to each other at the inside or outside of the touch region TA, or may be separated from each other.

For example, as illustrated in FIG. 6, when the first sensing electrodes 410 disposed in a same row are connected to each other within the touch region TA, the second sensing electrodes 420 disposed in a same column may be connected to each other within the touch region TA. That is, the first sensing electrodes 410 disposed in each row may be connected to each other through a first connector 412, and the second sensing electrodes 420 disposed in each column may be connected to each other through a second connector 422.

Referring to FIG. 7 and FIG. 8, the second connector 422 connecting the adjacent second sensing electrodes 420 is disposed on the display area 100, and the first insulation layer 431 is disposed thereon. The first sensing electrodes 410, the second sensing electrodes 420, and the first connector 412 connecting the adjacent first sensing electrodes 410 may be disposed on the first insulating layer 431. A second insulating layer 432 may be disposed on the first sensing electrodes 410, the second sensing electrodes 420, and the first connector 412 in order to protect them.

The second sensing electrode 420 is electrically connected to the second connector 422 through a contact hole formed in the first insulating layer 431. A portion of the first connector 412 overlaps the second connector 422, but is physically and electrically separated therefrom by the first insulating layer 431. The first sensing electrodes 410, the second sensing electrodes 420, and the first connector 412 may formed of a same material, and they may be patterned simultaneously. The second connector 422 may be formed of a same material as touch signal lines 411 and 421 (refer to FIG. 6), and they may be patterned simultaneously.

The second sensing electrodes 420 and the first connector 412 may be disposed at a same layer on an upper substrate, and the second connector 422 may be formed below the second sensing electrodes 420 and the first connector 412 with the first insulating layer 431 therebetween. The second connector 422 connecting the adjacent second sensing electrodes 420 may be disposed at a same layer as the first sensing electrodes 410 and may be integrated with the second sensing electrodes 420. The first connector 412 connecting the neighboring first sensing electrodes 410 may be disposed on a different layer from the first sensing electrodes 410. Various other modifications for connection between the sensing electrodes are possible and within the spirit and scope of the invention.

Referring to FIG. 6, the first sensing electrodes 410 connected to each other in each row may be connected to a touch sensor controller (not illustrated) through the first touch signal line 411, and the second sensing electrodes 420 connected to each other in each column may be connected to the touch sensor controller through the second touch signal line 421. The first touch signal line 411 and the second touch signal line 421 may be disposed in a peripheral area PA of the display panel as illustrated therein, but may be disposed in the touch area TA.

The first sensing electrodes 410 and the second sensing electrodes 420 may have a predetermined transmittance enough for light to be transmitted through the display area 100. For example, the first sensing electrodes 410 and the second sensing electrodes 420 may be formed of a thin metal layer or layers of a transparent conductive material such as an indium tin oxide (ITO), an indium zinc oxide (IZO), or a silver nanowire (AgNW), a metal mesh, or carbon nanotubes (CNTs), but the invention is not limited thereto.

The first sensing electrode 410 and the second sensing electrode 420, which are adjacent each other, may constitute a mutual capacitor functioning as a touch sensor. The mutual capacitor may receive a driving signal through one of the first sensing electrode 410 and the second sensing electrode 420, and may output a change in a charge amount by the touch of an external object as a sensing signal through the remaining sensing electrodes.

Different from the embodiment as illustrated in FIG. 6 to FIG. 8, the first sensing electrodes 410 may be separated from each other and the second sensing electrodes 420 may be separated from each other to form independent sensing electrodes, and may be connected to the touch sensor controller through their own touch wires (not illustrated). Each sensing electrode may constitute a self-capacitor as a touch sensor. The self-capacitor may be charged with a predetermined charge amount by receiving a drive signal, and when the self-capacitor is contacted by an external object such as a finger, the charged charge amount changes so that a sense signal different from the inputted drive signal may be outputted.

Referring to FIG. 9, the first sensing electrodes 410 may be formed in a mesh shape. The second sensing electrodes 420 may also be formed in the mesh shape. Each of the mesh-shaped sensing electrodes 410 and 420 may be disposed to overlap the partition wall 361.

Further description of structure of a display area of the display device according to an exemplary embodiment of the invention follows below with reference to FIG. 10 and FIG. 11.

Figure 10:
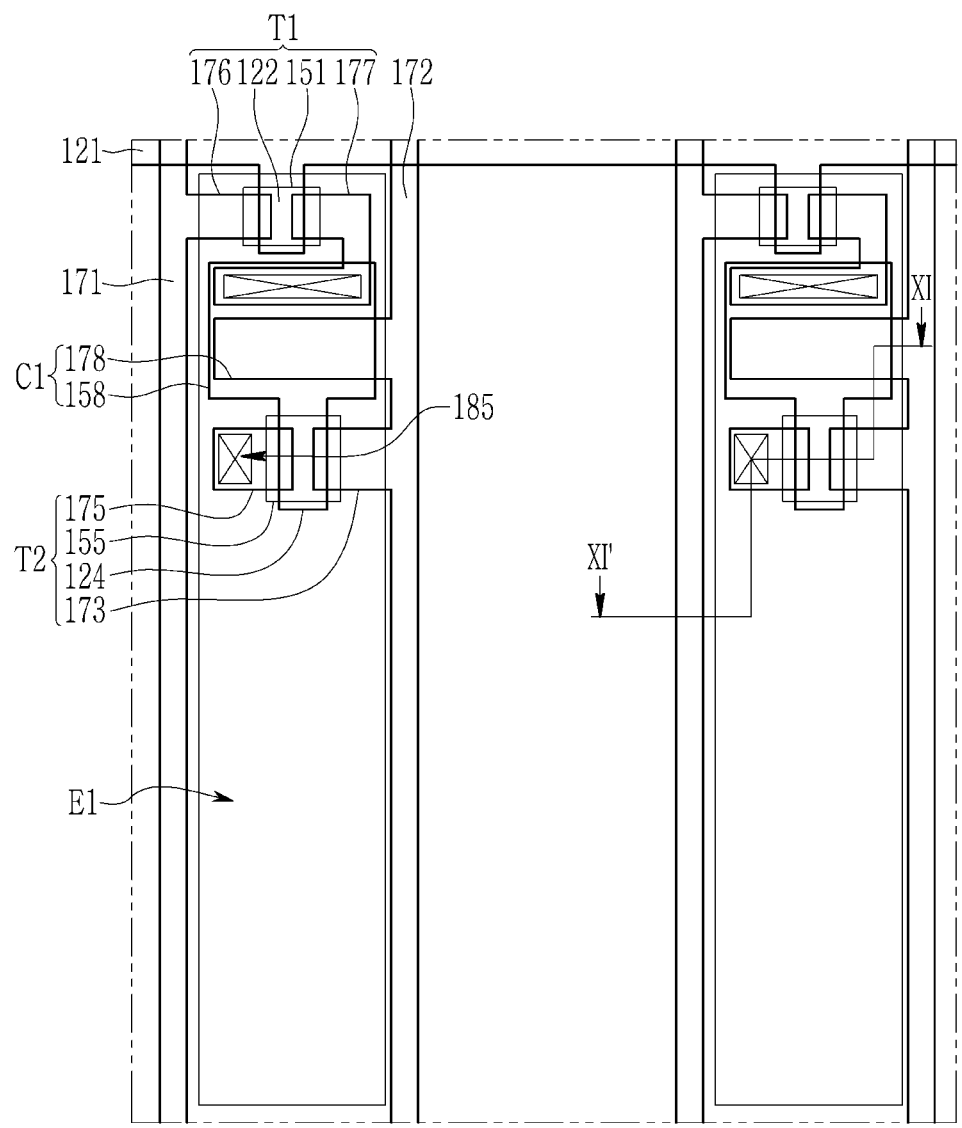
FIG. 10 illustrates a schematic top plan view of a display area of a display device according to an exemplary embodiment of the invention.

FIG. 10 illustrates a schematic top plan view of a display area of the display device according to an exemplary embodiment of the invention. FIG. 11 is a cross-sectional view taken along line XI-XI' of FIG. 10.

In the drawing, an active matrix (AM) type of emissive display device having a 2Tr-1Cap structure including two thin film transistors T1 and T2 and one capacitor C1 are provided for each pixel of a display area, but the invention and embodiment are not limited thereto. Other modifications are possible and within the spirit and scope of the invention.

Alternatively, the emissive display device may have three or more transistors and two or more charge elements in one pixel, and a separate wire may be further formed to have various structures. Herein, a pixel is a minimum unit for displaying an image, and the display area displays an image through pixels.

Figure 11:
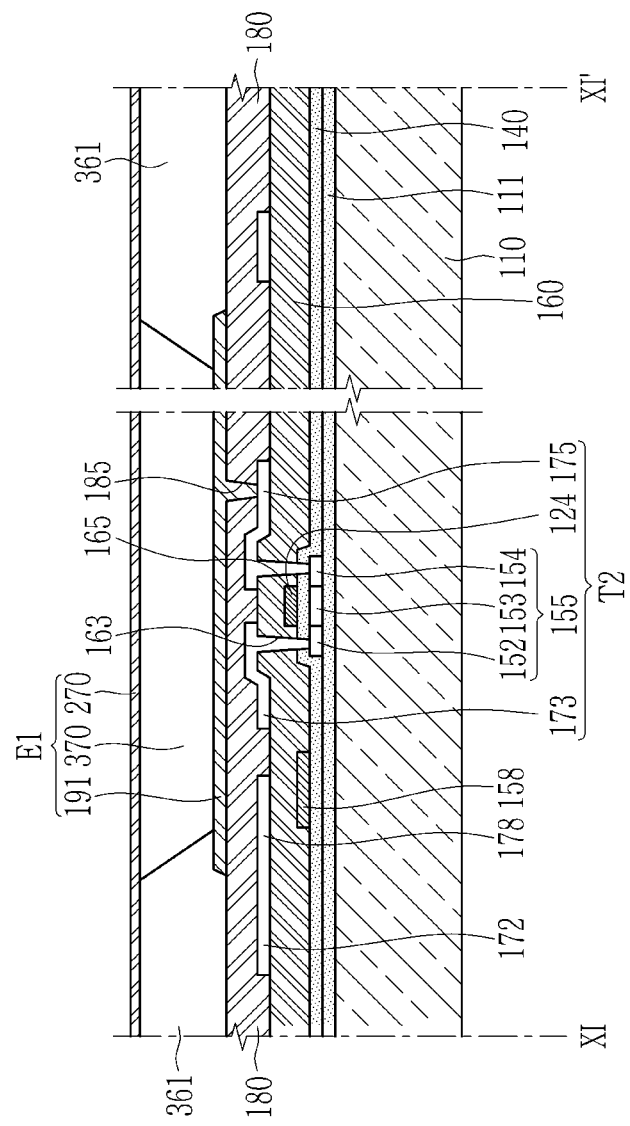
FIG. 11 illustrates a cross-sectional view taken along line XI-XI' of FIG. 10.

Referring to FIG. 10 and FIG. 11, the emissive display device includes a switching thin film transistor T1, a driving thin film transistor T2, a capacitor C1, and a light emitting element E1 formed in each of the pixels disposed on the substrate 110. A gate line 121 disposed along one direction, a data line 171 and a common power line 172 insulated from the gate line 121 to intersect therewith are disposed on the substrate 110. Herein, each pixel may be defined as a boundary between the gate line 121, the data line 171, and the common power line 172, but the invention is not limited thereto.

The organic light emitting element E1 includes the first electrode 191, the emission layer 370 disposed on the first electrode 191, and the second electrode 270 disposed on the emission layer 370.

Herein, the first electrode 191 serves as an anode which is a hole injection electrode, and the second electrode 270 serves as a cathode which is an electron injection electrode. However, the invention is not limited thereto, and the first electrode 191 may serve as a cathode and the second electrode 270 may serve as an anode depending on a driving method of an emission display device. The first electrode 191 may be a pixel electrode, and the second electrode 270 may be a common electrode, but the invention is not limited to this configuration.

The emission layer 370 may include at least one of a hole-injection layer, a hole-transporting layer, an emission layer, an electron-transporting layer, and an electron-injection layer. Among these, the emission layer may include an organic emission layer, and light is emitted when excitons generated by the combination of injected holes and electrons fall from an excited state to a ground state. Alternatively, the emission layer may include quantum dots.

The capacitor element C1 includes a pair of capacitor plates 158 and 178 disposed with an interlayer insulating layer 160 interposed therebetween. Herein, the interlayer insulating layer 160 (FIG. 11) may function as a dielectric material. The capacitance is determined by the voltage between charges accumulated in the capacitor C1 and the pair of capacitor plates 158 and 178.

The switching thin film transistor T1 includes a switching semiconductor layer 151, a switching gate electrode 122, a switching source electrode 176, and a switching drain electrode 177. The driving thin film transistor T2 includes a driving semiconductor layer 155, a driving gate electrode 124, a driving source electrode 173, and a driving drain electrode 175.

The switching thin film transistor T1 is used as a switching element to select the pixel to emit. The switching gate electrode 122 is connected to the gate line 121, and the switching source electrode 176 is connected to the data line 171. The switching drain electrode 177 is disposed apart from the switching source electrode 176 to be connected to one of the storage plates 158 and 178 (e.g., the first capacitor plate 158).

The driving thin film transistor T2 applies driving power for driving the emission layer 370 of the organic light emitting element E1 in the selected pixel, to the first electrode 191. The driving gate electrode 124 is connected to the first capacitor plate 158 connected to the switching drain electrode 177. The driving source electrode 173 and the second storage plate 178 are connected to the common power supply line 172.

The driving drain electrode 175 is connected with the first electrode 191 through a contact hole 185.

An organic light emitting diode display according to an embodiment of the invention will be described in more detail as follows with reference to FIG. 11 together with FIG. 10.

A buffer layer 111 is disposed on the substrate 110. The substrate 110 may be made of glass, quartz, ceramic, or plastic, or other suitable material. The buffer layer 111 may be made of a silicon nitride (SiNx), a silicon oxide ($SiO_2$), a silicon oxynitride (SiOxNy), and the like, but the invention is not limited thereto. Herein, x and y may be 1 to 5.

The driving semiconductor layer 155 is disposed on the buffer layer 111. The driving semiconductor layer 155 may be formed of various semiconductor materials such as a polycrystalline silicon film and an amorphous silicon film. The driving semiconductor layer 155 may include a source region 152, a channel region 153, and a drain region 154.

A gate insulating layer 140 made of a silicon nitride or a silicon oxide is disposed over the driving semiconductor layer 155. The driving gate electrode 124 and the first capacitor plate 158 are disposed on the gate insulating layer 140. The driving gate electrode 124 is disposed over at least a part of the driving semiconductor layer 155, which may be the channel region 153 in an exemplary embodiment.

The interlayer insulating layer 160 covering the driving gate electrode 124 is disposed thereon. The interlayer insulating layer 160, like the gate insulating layer 140, may be formed of a silicon nitride or a silicon oxide or other suitable materials. The gate insulating layer 140 and the interlayer insulating layer 160 have a first contact hole 163 and a second contact hole 165 exposing the source region 152 and the drain region 154 of the driving semiconductor layer 155, respectively.

The driving source electrode 173, the driving drain electrode 175, the data line 171, the common power supply line 172, and the second capacitor plate 178 are disposed on the interlayer insulating layer 160. The driving source electrode 173 and the driving drain electrode 175 are connected to the source region 152 and the drain region 154 of the driving semiconductor layer 155 through the first contact hole 163 and the second contact hole 165, respectively.

The insulating layer 180 covering the driving source electrode 173 and the driving drain electrode 175 is disposed on the interlayer insulating layer 160. The insulating layer 180 may include an organic material such as polyacrylic, polyimide, or other suitable materials.

The insulating layer 180 may have the contact hole 185. The first electrode 191 is disposed on the insulating layer 180. The first electrode 191 may be a pixel electrode. The first electrode 191 is connected to the driving drain electrode 175 through the contact hole 185.

At least one partition wall 361 is disposed between the insulating layer 180 and the second electrode 270. A portion of the partition wall 361 may protrude to constitute a spacer (refer to FIG. 1). The emission layer 370 is disposed between the first electrode 191 and the second electrode 270. Particularly, the emission layer 370 may be disposed in an opening formed by the first electrode 191, the second electrode 270, and adjacent partition walls 361. The emission layer 370 may include at least one of a hole-injection layer, a hole-transporting layer, an emission layer, an electron-transporting layer, and an electron-injection layer. The first electrode 191 may be a common electrode. The light emitting element E1 includes the first electrode 191, the emission layer 370, and the second electrode 270.

A process of forming a first light blocking member 221 in a display device according to an exemplary embodiment of the invention will be described with reference to FIG. 12 to FIG. 19. FIG. 12 to FIG. 15 illustrate a process of forming the first light blocking member 221 in a region overlapping the spacer 362, and FIG. 16 to FIG. 19 illustrate a process of forming a color filter in a region where no spacer is disposed.

Figure 12:
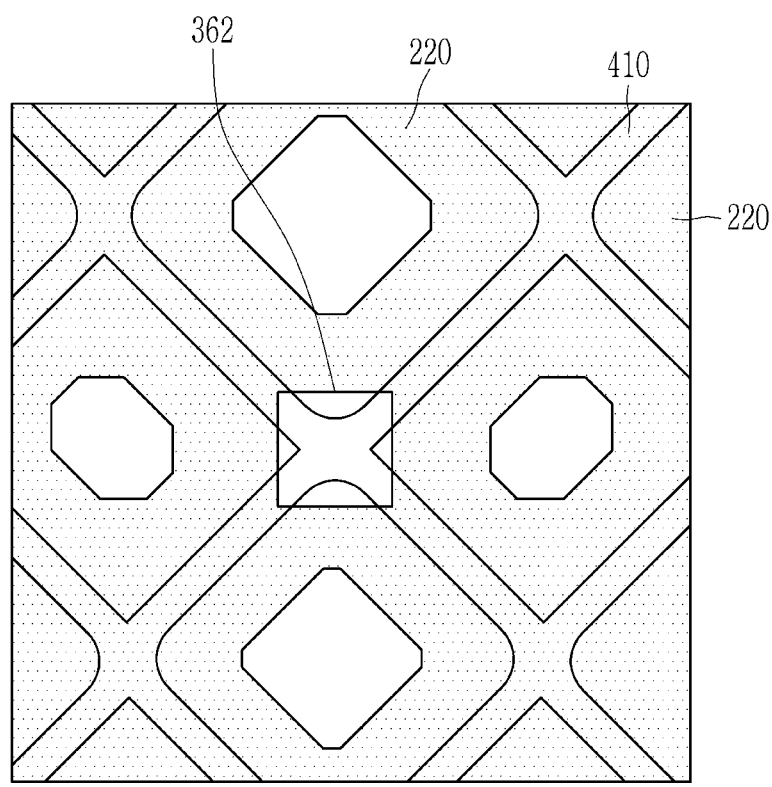
FIG. 12 to FIG. 15 illustrate a process of forming a first light blocking member in a region overlapping with a spacer.
Figure 16:
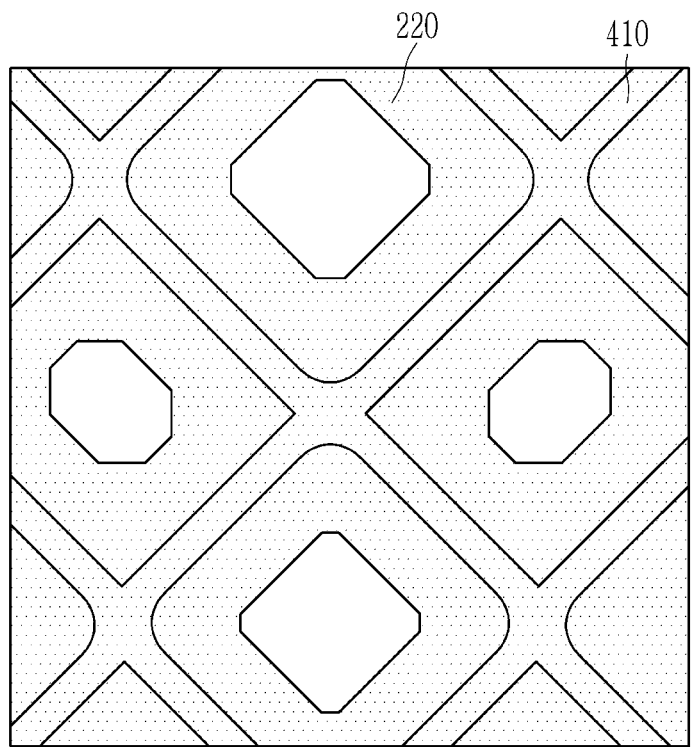
FIG. 16 to FIG. 19 illustrate a process of forming a color filter in a region where no spacer is disposed.

Referring to FIG. 12 and FIG. 16, a display device in which no color filter is formed is disposed. The spacer 362 may be disposed in a region illustrated in FIG. 12, while FIG. 16 illustrates a region where the spacer is not disposed.

Figure 13:
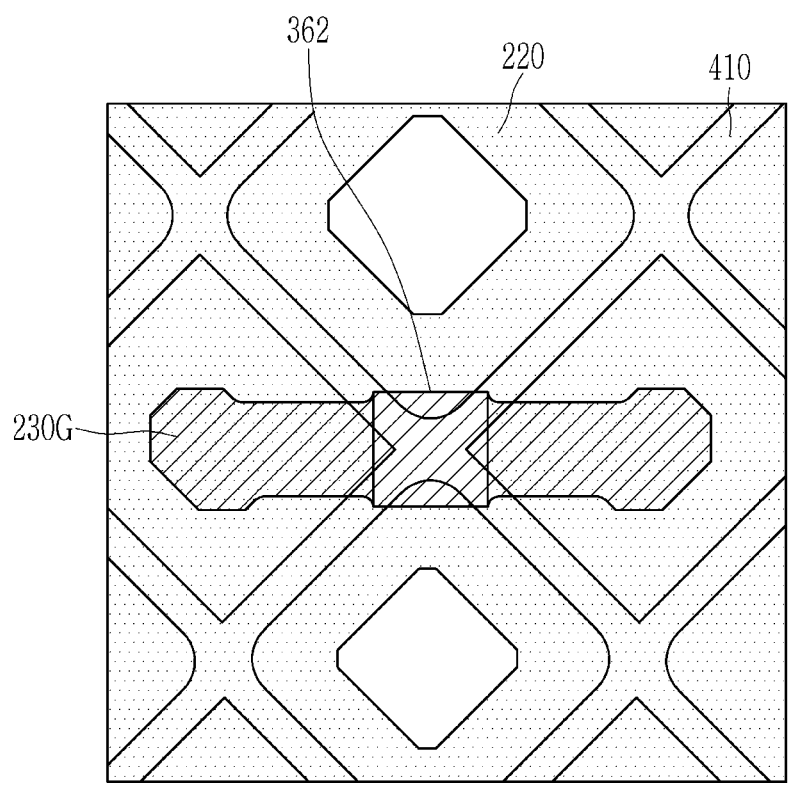
Figure 17:
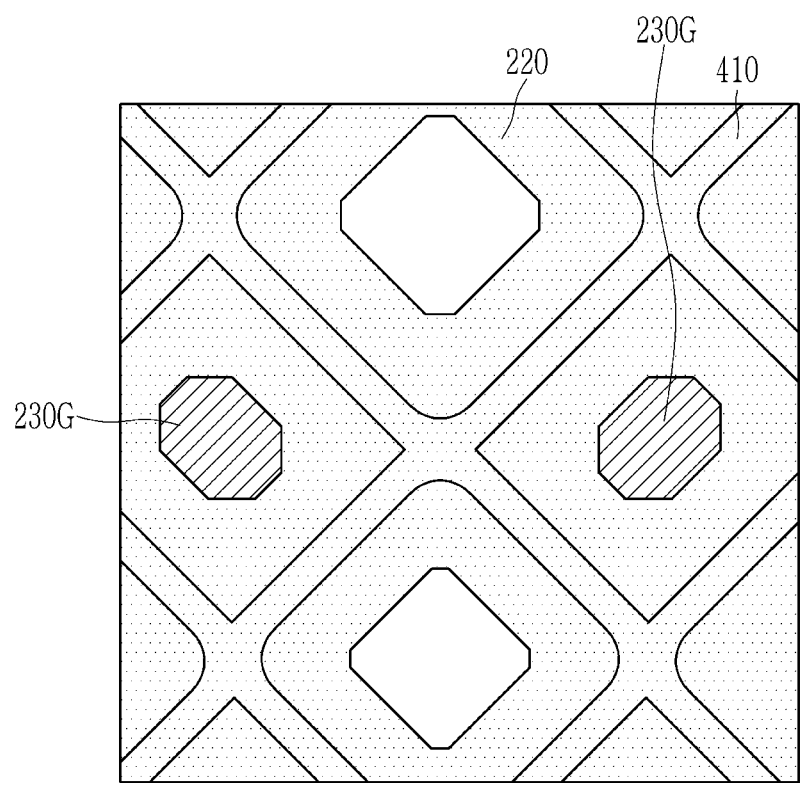

Referring to FIG. 13 and FIG. 17, the green color filter 230G is formed. Referring to FIG. 17, the green color filter 230G is formed to not overlap the first sensing electrode 410 in the region where the spacer 362 is not disposed, but referring to FIG. 13, the green color filter 230G is formed to overlap the first sensing electrode 410 and the spacer 362 in the region where the spacer 362 is disposed.

Figure 14:
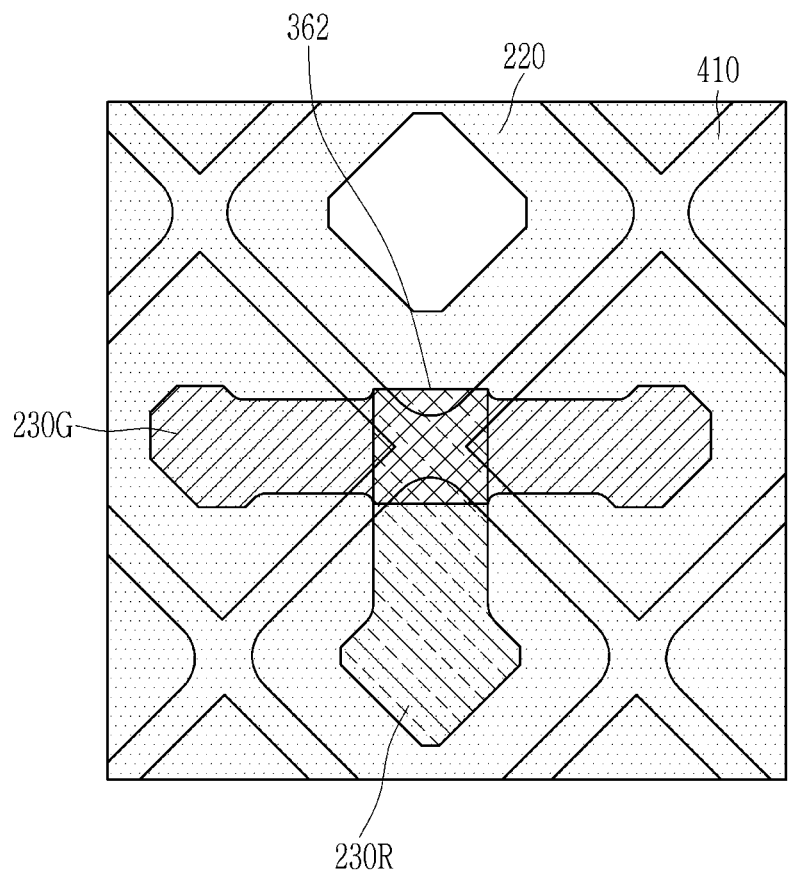
Figure 18:
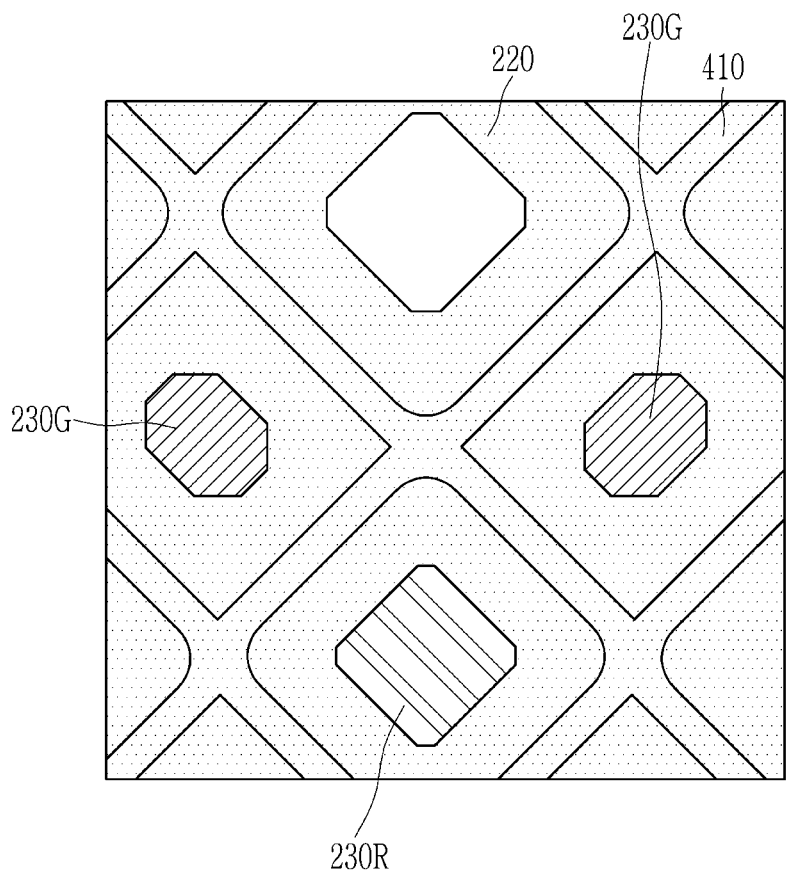

Referring to FIG. 14 and FIG. 18, the red color filter 230R is formed. Referring to FIG. 18, the red color filter 230R is formed to not overlap the green color filter 230G and the first sensing electrode 410 in the region where the spacer 362 is not disposed. However, referring to FIG. 14, the red color filter 230R is formed to overlap the green color filter 230G in the region where the spacer 362 is disposed. Accordingly, the green color filter 230G formed in FIG. 13 and the red color filter 230R formed in FIG. 14 are disposed to overlap each other at in the region where the spacer 362 is disposed.

Figure 15:
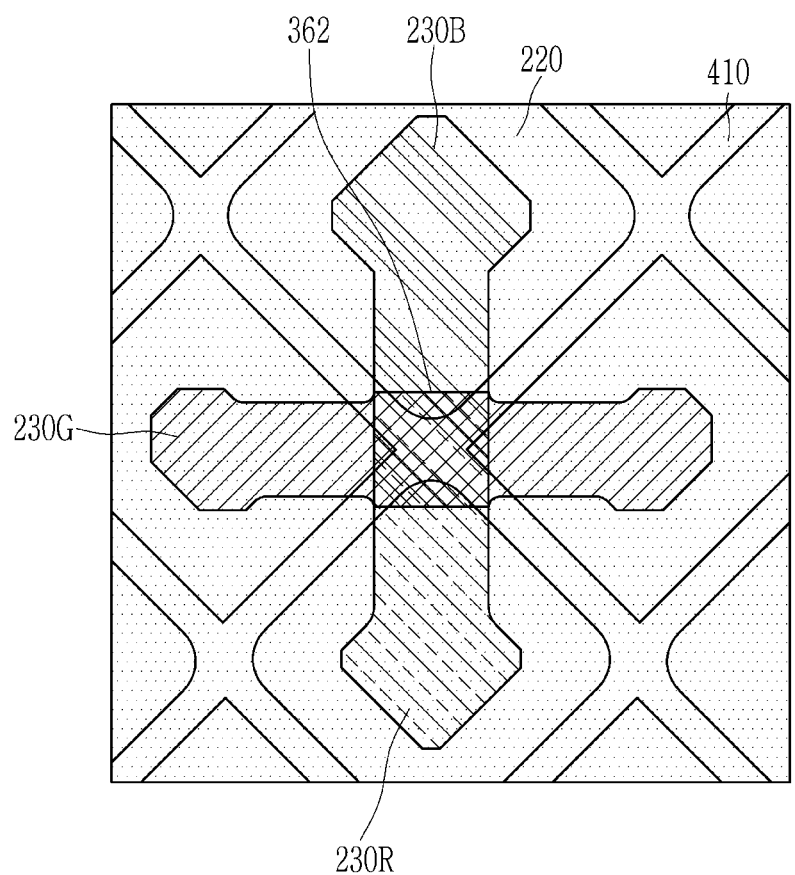
Figure 19:
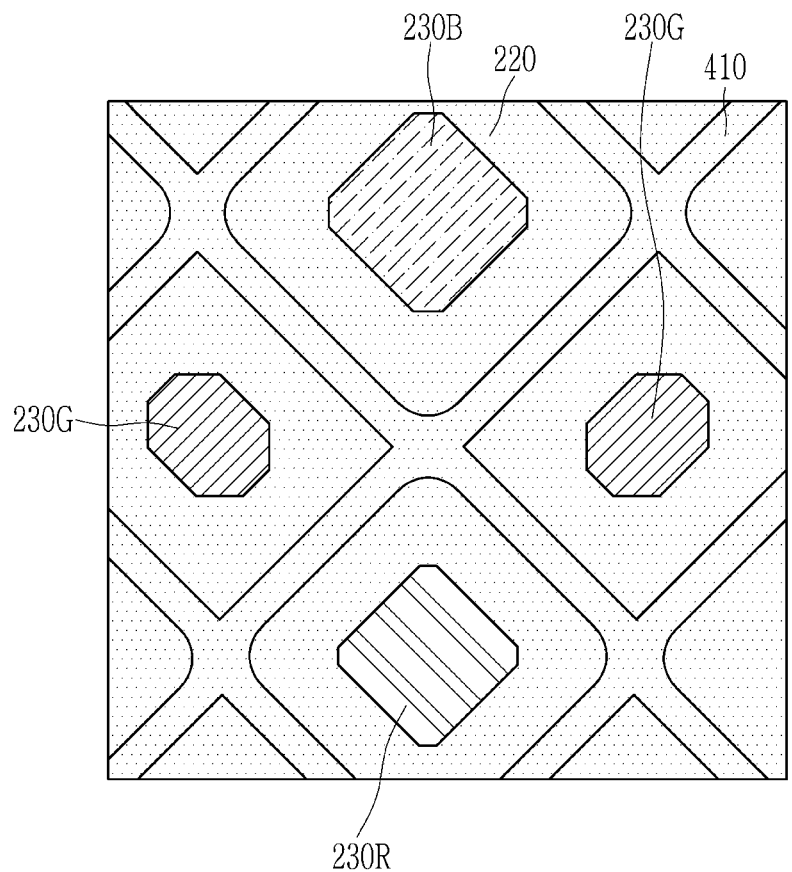

Referring to FIG. 15 and FIG. 19, the blue color filter 230B is formed. Referring to FIG. 19, the blue color filter 230B is formed to not overlap the red color filter 230R and the green color filter 230G in the region where the spacer 362 is not disposed. However, referring to FIG. 15, the blue color filter 230B is formed to overlap the red color filter 230R in the region where the spacer 362 is disposed. Accordingly, the green color filter 230G formed in FIG. 13, the red color filter 230R formed in FIG. 14, and the blue color filter 230B formed in FIG. 15 are disposed to overlap each other in the region where the spacer 362 is disposed.

Although a configuration in which the color filters 230R, 230G, and 230B do not overlap the second light blocking member 220 is illustrated in FIG. 13 to FIG. 19, the second light blocking member 220 may partially overlap edges of the color filters 230R, 230G, and 230B.

Figure 20:
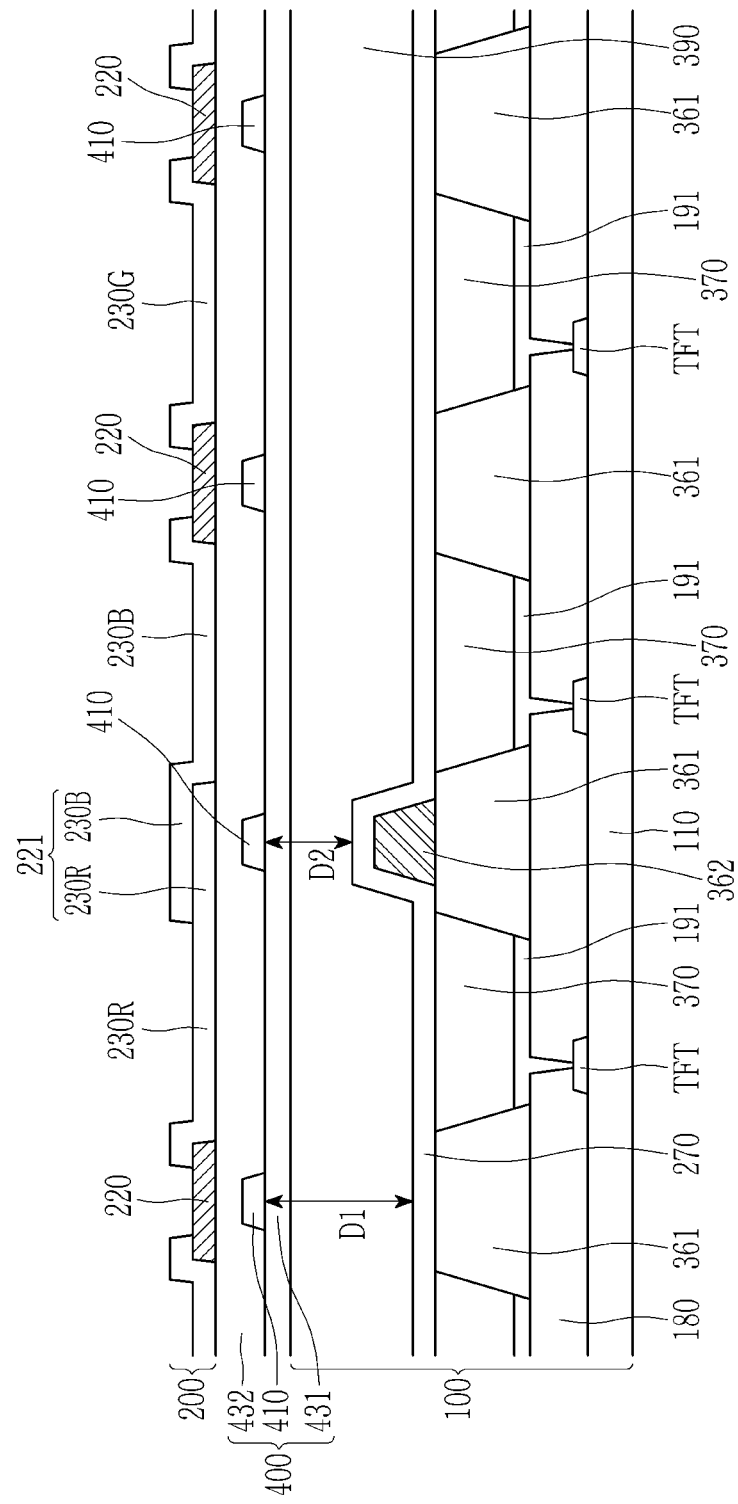
FIG. 20 illustrates a cross-section of a display device according to an exemplary embodiment of the invention.

FIG. 20 illustrates a cross-section corresponding to that of FIG. 1 according to an exemplary embodiment of the invention. Referring to FIG. 20, the display device according to the embodiment is similar to the display device according to the embodiment of FIG. 1, except that a first light blocking member 221 includes two color filters, for example, the red color filter 230R and the blue color filter 230B. Detailed description of the same constituent elements is omitted. Referring to FIG. 20, even when the first light blocking member 221 does not include the green color filter but includes only the red color filter 230R and the blue color filter 230B, it is possible to block light similar to FIG. 1.

As described above, the display device according to an embodiment of the invention minimizes the difference in touch sensitivity caused by the difference in distance between the second electrode 270 and the first sensing electrode 410 in the region where the spacer 362 is disposed and the region overlapping the partition walls 361 on which no spacer is disposed, by removing the second light blocking member 220 in the region overlapping the spacer 362 and allowing the first light blocking member 221 to perform a light blocking function similar to that of the second light blocking member 220.

While the invention has been illustrated and described with reference to the embodiments thereof, it will be apparent to those of ordinary skill in the art that various changes in form and detail may be formed thereto without departing from the spirit and scope of the invention.

What is claimed is:
1. A display device comprising:
a display area;
a color filter area disposed over the display area; and
a touch area disposed between the display area and the color filter area, wherein the display area includes:
a substrate on which a transistor is disposed;
an insulating layer disposed over the substrate and the transistor;
a first electrode connected with the transistor and disposed over the insulating layer;
a second electrode disposed over the first electrode;
a partition wall disposed between the insulating layer and the second electrode;
an emission layer disposed in an opening formed by the partition wall, and
a spacer disposed on the partition wall, and
wherein
the partition wall includes a first region overlapping the spacer and a second region not overlapping the spacer,
the color filter area includes:
a first light blocking member disposed at a region overlapping the first region of the partition wall, the first light blocking member including at least two color filters stacked on each other; and
a second light blocking membered disposed at a region overlapping the second region of the partition wall, and
the first light blocking member and the second light blocking member include different materials.

2. The display device of claim 1, wherein the region at which the first light blocking member is disposed and the first region of the partition wall are facing and overlapping each other.

3. The display device of claim 1, wherein the first light blocking member includes a portion of a red color filter and a portion of a blue color filter, wherein the portion of the red color filter and the portion of the blue color filter are stacked on each other.

4. The display device of claim 3, wherein the first light blocking member further includes a portion of a green color filter, wherein the portions of the green color filter, the red color filter, and the blue color filter are stacked on each other.

5. The display device of claim 1, wherein the touch area includes:
a first sensing electrode disposed at a region overlapping the first light blocking member; and
another first sensing electrode disposed at a region overlapping the second light blocking member.

6. The display device of claim 5, wherein a distance between the second electrode and the first sensing electrode is smaller than a distance between the second electrode and the another first sensing electrode.

7. The display device of claim 6, wherein the distance between the second electrode and the first sensing electrode is in a range of about 6 µm to about 8 µm.

8. The display device of claim 6, wherein the distance between the second electrode and the another first sensing electrode is in a range of about 8 µm to about 10 µm.

9. The display device of claim 5, wherein the touch area further includes a second sensing electrode having a mesh structure with at least one of the first sensing electrode and the another first sensing electrode.

10. The display device of claim 9, wherein the at least one of the first sensing electrode and the another first sensing electrode and the second sensing electrode do not overlap the emission layer.

11. The display device of claim 5, wherein the region at which the first sensing electrode is disposed is overlapping and facing a region at which the first light blocking member is disposed and the first region of the partition wall.

12. The display device of claim 1, wherein the spacer has a height in a range of about 1 µm to about 2 µm.

13. The display device of claim 1, wherein the second light blocking member includes carbon black.

14. The display device of claim 1, wherein the display area includes spacers each disposed on the first regions of the partition wall, and a disposal density of the spacers is in a range of about 5% to about 20%, wherein the disposal density is a ratio between a number of the first region of the partition wall on which spacers are respectively disposed and a total number of the first region and the second region of the partition wall in the display area.

15. The display device of claim 1, wherein the display device does not include a polarization layer.

16. The display device of claim 1, wherein the partition wall and the spacer are formed of a same material, and are connected with each other.

17. The display device of claim 1, wherein the partition wall and the spacer are formed of a different material.

18. A manufacturing method of a display device, the method comprising:
forming a display area including an emission layer, a partition wall, and a spacer disposed on the partition wall, and the partition wall includes a first region overlapping the spacer and a second region not overlapping the spacer;
forming a touch area overlapping the display area, the touch area including a sensing electrode;
forming a first color filter in a color filter area over the touch area to overlap the spacer and the emission layer;
forming a second color filter in the color filter area over the touch area to overlap the spacer and the emission layer; and
forming a first light blocking member disposed at a region overlapping the first region of the partition wall, the forming the first light blocking member including:
disposing a portion of the first color filter at the region overlapping the first region of the partition wall; and
disposing a portion of the second color filter at the region overlapping the first region of the partition wall by stacking the portion of the second color filter on the portion of the first color filter,
forming a second light blocking member disposed at a region overlapping the second region of the partition wall, and
the first light blocking member and the second light blocking member include different materials.

19. The manufacturing method of claim 18, further comprising forming a third color filter over the touch area to overlap the spacer and the emission layer,
wherein the forming the first light blocking member further includes disposing a portion of the third color filter at the region overlapping the spacer so that the portions of the first, second and third color filters are stacked on each other at the region overlapping the spacer.

20. The manufacturing method of claim 19, wherein the first color filter is a red color filter, the second color filter is a blue color filter, and the third color filter is a green color filter, and
the portion of the first color filter is disposed between the portion of the second color filter and the portion of the third color filter.

21. The manufacturing method of claim 18, wherein the forming the touch area includes forming a sensing electrode disposed at a region overlapping the first light blocking member.

22. The manufacturing method of claim 18, wherein the forming the touch area includes forming another sensing electrode disposed at a region overlapping the second light blocking member.

23. The manufacturing method of claim 18, wherein the forming the display area includes a single process of forming the spacer and the partition wall.

24. The manufacturing method of claim 18, wherein the forming the display area includes forming the spacer on the partition wall to have a height in a range of about 1 μm to about 2 μm.

* * * * *